(12) United States Patent  (10) Patent No.: US 9,414,499 B2
van Aalst et al.  (45) Date of Patent: Aug. 9, 2016

(54) METHOD FOR PARTIALLY STRIPPING A DEFINED AREA OF A CONDUCTIVE LAYER

(75) Inventors: Jan van Aalst, Barsinghausen (DE); Drago Kovacic, Ljutomer (SI); Bostjan Podobnik, Ljubljana (SI)

(73) Assignee: LPKF LASER & ELECTRONICS AG, Garbsen (DE)

( * ) Notice: Subject to any disclaimer, the term of this patent is extended or adjusted under 35 U.S.C. 154(b) by 732 days.

(21) Appl. No.: 13/695,870

(22) PCT Filed: Mar. 23, 2011

(86) PCT No.: PCT/DE2011/075047
  § 371 (c)(1),
  (2), (4) Date: Nov. 2, 2012

(87) PCT Pub. No.: WO2011/137896
  PCT Pub. Date: Nov. 10, 2011

(65) Prior Publication Data
  US 2013/0048618 A1  Feb. 28, 2013

(30) Foreign Application Priority Data
  May 4, 2010 (DE) .......................... 10 2010 019 406

(51) Int. Cl.
  *H05K 3/02* (2006.01)
  *B23K 26/36* (2014.01)
(52) U.S. Cl.
  CPC ................ *H05K 3/027* (2013.01); *B23K 26/36* (2013.01); *B23K 2201/38* (2013.01); *H05K 2201/062* (2013.01); *H05K 2201/09363* (2013.01)
(58) Field of Classification Search
  CPC . H05K 3/027; H05K 3/025; H05K 2203/107; H01L 2924/00

USPC ............ 219/121.69, 121.68, 121.72, 121.71; 29/846, 830
  See application file for complete search history.

(56) References Cited

U.S. PATENT DOCUMENTS 3,214,315 A * 10/1965 Hildebrand ............ H05K 3/041
  156/122
5,494,781 A *  2/1996 Ohtani et al. ................. 430/313
(Continued)

FOREIGN PATENT DOCUMENTS

DE          69411337 T2   2/1999
DE      102004006414 B4   8/2008
(Continued)

OTHER PUBLICATIONS

WO2005076678A1—English Machine Translation of Description.*
(Continued)

*Primary Examiner* — David Angwin
*Assistant Examiner* — Lawrence Samuels
(74) *Attorney, Agent, or Firm* — Leydig, Voit & Mayer, Ltd.

(57) ABSTRACT

A method for partial detachment of a defined area of a conductive layer using a laser beam includes forming a conductor track with a defined path from the conductive layer on the substrate, the path defining main axes. The area is segmented into zones. A linear recess is provided along a respective perimeter of each of the zones. Each of the zones has a strip shape such that the recesses extend along paths that are substantially straight lines not parallel to either of the main axes. One of the zones to be removed is heated using laser radiation until adhesion of the conductive layer to the substrate is substantially reduced and the zone to be removed is detached in a surface-wide manner from the substrate under external influences. Laser-beam parameters are set such that only the conductive layer is removed without affecting an underlying substrate.

14 Claims, 1 Drawing Sheet

(56) References Cited

U.S. PATENT DOCUMENTS

| | | | | |
|---|---|---|---|---|
| 5,525,205 | A * | 6/1996 | Miyashita | H05K 3/027 205/125 |
| 5,759,416 | A * | 6/1998 | Bosman et al. | 216/13 |
| 6,107,119 | A * | 8/2000 | Farnworth | G01R 31/2867 438/106 |
| 6,461,527 | B1 * | 10/2002 | Haupt et al. | 216/18 |
| 7,237,334 | B2 * | 7/2007 | Salama | H05K 3/185 219/121.18 |
| 2001/0006766 | A1 | 7/2001 | O'Brien et al. | |
| 2002/0106522 | A1 | 8/2002 | McCormack et al. | |
| 2003/0000916 | A1 * | 1/2003 | De Steur et al. | 216/13 |
| 2003/0047280 | A1 | 3/2003 | Takayama et al. | |
| 2003/0075532 | A1 * | 4/2003 | Salmon et al. | 219/121.69 |
| 2003/0180448 | A1 * | 9/2003 | Brook-Levinson et al. | 427/96 |
| 2007/0130754 | A1 | 6/2007 | Fein | |
| 2007/0212878 | A1 * | 9/2007 | Johnson | H05K 1/025 438/669 |
| 2008/0083706 | A1 | 4/2008 | Kirmeier | |

FOREIGN PATENT DOCUMENTS

| | | |
|---|---|---|
| EP | 0834191 A1 | 4/1998 |
| JP | 4116887 A | 4/1992 |
| JP | 2003047841 A | 2/2003 |
| WO | WO 9009730 A1 | 8/1990 |
| WO | WO 2005076678 A1 * | 8/2005 ............... H05K 3/02 |

OTHER PUBLICATIONS

European Patent Office, International Search Report in International Patent Application No. PCT/DE2011/075047 (Jul. 25, 2011).

* cited by examiner

METHOD FOR PARTIALLY STRIPPING A DEFINED AREA OF A CONDUCTIVE LAYER

CROSS-REFERENCE TO PRIOR APPLICATIONS

This application is a U.S. National Phase application under 35 U.S.C. §371 of International Application No. PCT/DE2011/075047, filed on Mar. 23, 2011, and claims benefit to German Patent Application No. DE 10 2010 019 406.9, filed on May 4, 2010. The International Application was published in German on Nov. 10, 2011 as WO 2011/137896 under PCT Article 21(2).

FIELD

The invention relates to a method for partial detachment of a defined area of a conductive layer, in particular a copper layer, by means of a laser beam, to leave behind a conductor track, wherein a conductor track having a defined path is formed from the conductive layer on the substrate, and wherein the laser-beam parameters are set such that only the conductive layer is removed, without the underlying substrate that supports the conductive layer also being affected at the same time, wherein the area is initially segmented into zones, the outer edge region of each of said zones being thermally insulated from the adjoining zones of the conductive layer by making a linear recess along a respective perimeter of the zones, and then a zone to be removed is heated by laser radiation until the adhesion of the conductive layer to the substrate is substantially reduced and the zone to be removed is detached surface-wide from the substrate under external influences.

BACKGROUND

A method for partial detachment or removal of a conductive layer from a, for example, flexible or polymer circuit substrate, in particular also a three-dimensional circuit substrate, or from a conventional printed circuit board is known from DE 10 2004 006 414 B4, for instance, and is used in practice in particular when it is not possible or desirable to remove the required area chemically, which is the case in the field of prototype fabrication, for example.

Using laser radiation to remove a conductive layer is hence already fundamentally known. Provided the material properties of the substrate have far higher limiting values compared with the conductive layer, in particular with regard to the laser ablation limiting values required in a particular case or even the melting points, the laser parameters can be set such that only the conductive layer is removed by the laser beam, whereas the substrate is not damaged or affected. For this purpose, the zone to be removed is heated by a laser beam. The area to be removed is composed of individual zones, which may be in the shape of strips, with the bounding recesses running substantially along parallel straight lines.

U.S. Pat. No. 3,214,315 relates to a method in which a stamp is used to separate the conductor track mechanically from the area to be detached, the stamp being warmed in order to achieve weak adhesion of the area to the substrate. Once the area has been removed, further heat input is used to cure the substrate and hence to permanently bond the conductor tracks to the substrate.

A method for laser removal of conductive layers by reducing the adhesion between conductive layer and substrate is known from EP 0 834 191 B1. Similar methods are also described in US 2003/0047280 A1 and JP 2003-47841 A.

US 2001/006766 A1 discloses a method in which electromagnetic radiation is used through the surface of the area to weaken the bond between the area and the substrate in order subsequently to detach the area in these zones. The advantage lies in the reduced amount of energy input to achieve this, which is low compared with the ablation energy of the layer.

DE 694 11 337 T2 teaches a method for producing a conductive circuit on a resin moulding, in which an applied metal film is exposed to laser radiation along the boundaries of a portion that is to be formed in the conductive layer, in order to remove the exposed metal film. The portion of the metal film that is not needed for the circuit is removed by chemical etching.

In addition, a method for removing a conductive layer from a dielectric substrate is known from US 2002/0106522 A1, in which initially a cut is made using a laser beam along the boundary line of that region of the conductive layer that is to be removed, and then the conductive layer is peeled off.

WO 90/09730 A1 teaches a method for producing an electrode pattern from a layer made of electrically conductive material on an insulating substrate by means of a laser beam, said electrodes being in the shape of strips. Removal is performed by means of compressed air or suction.

SUMMARY

In an embodiment, the present invention provides a method for partial detachment of a defined area of a conductive layer using a laser beam includes forming a conductor track with a defined path from the conductive layer on the substrate, the path defining main axes (X, Y). The area is segmented into zones. A linear recess is provided along a respective perimeter of each of the zones so as to thermally insulate an outer edge region of each of the zones from adjoining ones of the zones. Each of the zones has a strip shape such that the recesses extend along paths that are substantially straight lines. The paths of the recesses extend in a direction that is not parallel to either of the main axes (X, Y). One of the zones to be removed is heated using laser radiation until adhesion of the conductive layer to the substrate is substantially reduced and the zone to be removed is detached in a surface-wide manner from the substrate under external influences. Laser-beam parameters in the laser radiation are set such that only the conductive layer is removed without affecting an underlying substrate that supports the conductive layer.

BRIEF DESCRIPTION OF THE DRAWINGS

The present invention will be described in even greater detail below based on the exemplary figures. The invention is not limited to the exemplary embodiment. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
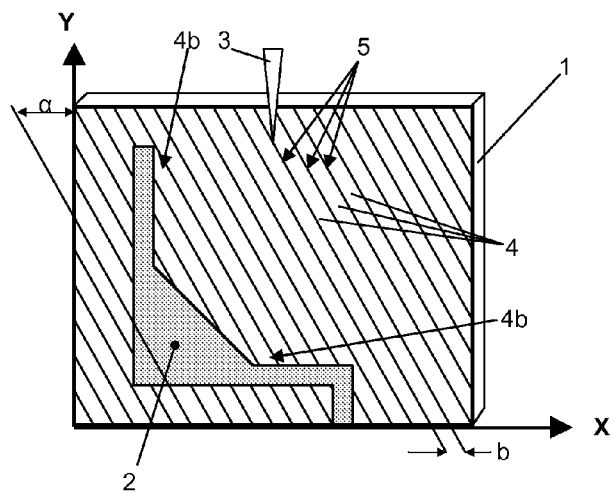
FIG. 1 shows a schematic diagram of a conductor track on a substrate, and an area to be removed that encloses this conductor track and is segmented into strip-shaped zones.

Particular requirements are placed on the segmentation of the area to be removed into individual zones. For this purpose, the area is often segmented into strips of predetermined width, which are optimised with respect to the thermal energy input to be introduced subsequently for rapid detachment of the area. It proves awkward in practice that often at least one strip adjoining the conductor track or an edge does not have the optimum width, i.e. has a smaller surface area. To avoid running the risk that the thermal energy is too great and hence results in damage to the adjoining conductor track, the recess adjacent to the conductor track is often dispensed with and the correspondingly enlarged zone is removed separately. Thus extra finishing work is required, which is undesirable.

One idea that has been considered is to divide the area to be segmented into strips of equal width, the path of which strips is chosen to run parallel to a main extension of the conductor tracks. In practice, however, the conductor tracks generally do not run only in one direction. In addition, the width of the conductor tracks varies. Hence different widths of the strip-shaped zones still result, and therefore the thermal energy input for these remaining zones of different size would need to be set individually or manual removal would be required.

In an embodiment, the invention provides an improved method in which, in particular, an advantageous partitioning of the zones is provided, by means of which surface-wide removal is further improved and damage to adjoining conductor tracks is avoided.

According to an embodiment of the invention, a method for partial detachment of a defined area of a conductive layer is thus provided in which the zones are formed in strip shapes, so that the recesses run substantially along straight lines, the path of which is chosen such that said recesses do not run parallel to any of the main axes defined by the known path of the conductor tracks. By segmenting the area to be removed into strips of predetermined width, which in particular is optimised with respect to the subsequent thermal energy input, and by choosing the orientation of the recess that segments the zones as dividing line to deviate from the main axes of the conductor tracks, then a path parallel to a conductor track is extremely unlikely in practice. Instead, the recesses each enclose an acute angle with the respective conductor track. Preferably, the known path of the conductor tracks could also be detected initially, and an angular path of the recesses could be defined that differs from all the detected orientations of the conductor tracks, in particular has a maximum difference. The invention, in an embodiment, also makes use of the fact that the conductor tracks generally run in the direction of the X-axis or Y-axis or at a 45° angle thereto. A different angle means that the recesses always meet the conductor track at an acute angle, i.e. never run parallel, and therefore they can be removed as a whole. The advantage according to an embodiment of the invention now lies in the fact that orientating the recesses in the manner thus defined avoids a path parallel to the conductor tracks and hence avoids a parallel thermal energy input to make the recess for segmenting the adjacent zones, and therefore can substantially reduce an unwanted energy input to the conductor track and can rule out any damage to same.

In addition, the end regions of each strip-shaped zone converge and hence the width is reduced in the end region. The thermal energy required for detachment is thus likewise reduced, and therefore the thermal energy input can be reduced at least in the end region adjacent to a conductor track. For example, the laser for the thermal energy input can always keep a sufficient distance from the conductor track without making it harder to detach the end region. Instead, although the laser approaches the conductor track while heating the zone, it never runs parallel to said track.

The triangular zones that may be created can also be removed separately in a simple manner, because only a small amount of heat needs to be input to do this, and furthermore this heat is not input parallel to the conductor track.

In a particularly advantageous embodiment of the method, the recesses enclose an acute angle both with the main axes and with the angle bisectors of the main axes, and run at an angle to a main axis of between 10° and 35°, in particular between 20° and 25°. It can thereby be achieved in practice, even without prior checking of the orientation of the conductor tracks, that a path parallel to the main axes and to the angle bisectors thereof is ruled out at least almost entirely. For example, an angle of 22.5° between the recesses and a main axis or an angle bisector is suitable for this purpose in practice.

In addition, a development has already proved particularly promising in practice, in which the recesses of a zone, excluding the respective end regions, run parallel to one another, and the zones also preferably have a uniform width. This not only simplifies the segmentation of the zones but also achieves optimum heat input and hence rapid and reliable reduction in the adhesion forces. It is thereby achieved that the layer to be detached is removed over a large area in the minimum of time.

Here it is particularly useful if the recesses in an end region are made with a curve or bend towards the conductor track at an angle of in particular 90° to the conductor track in order to avoid very small angles between the recess and the conductor track, which can result in melting and burning into the substrate. As it approaches the conductor track, the recess runs with a curve or a kink at the 90° angle onto the conductor track.

If the conductive layer is of suitable design, the area could be removed by magnetic or electrostatic forces. On the other hand, a modification is particularly advantageous in which the heated area is separated from the substrate by means of a targeted supply of compressed air, wherein a targeted jet of compressed air enables the conductive layer to be lifted up, starting from the edge towards the centre of the area.

In addition, it is also promising if suction is used to separate the heated surface from the substrate. This prevents heated, detached pieces being deposited on the substrate in another position and, owing to the stored thermal energy that they contain, being able to melt onto the substrate in this position to such an extent that they remain bonded thereto.

In this context, the direction of the fluid flow is preferably set such that it runs neither parallel nor orthogonal to the straight recesses. Based on the defined path of the previously made recesses, the strip-shaped zones heated by laser energy are thus removed in the subsequent operation by substantially reducing the adhesion of the conductive layer on the substrate and using a targeted supply of compressed air or using suction to separate the heated area from the substrate. The fluid flow generated for this purpose is oriented such that it does not run parallel to the recess and also does not run orthogonal to the recess. In fact, the fluid flow encloses with each of the recesses an acute angle, which preferably can be between 20° and 40°. Consequently, the airflow does not arrive simultaneously along the length of the recess, but successively at different regions of the long side of the strip-shaped recess. As a result, the area does not start to detach over the entire extent of the recess simultaneously but with a time offset, thereby concentrating the effect while also preventing already detached segments from folding over onto segments that are still adhering to the substrate.

It is advantageous here if the zones furthest from the fluid supply and/or closest to the suction system are heated first in order to prevent residues from the removal of previous strips being able to reach strips behind and affecting the removal thereof.

In addition, it is particularly useful here if each zone is heated by a heat input by means of a laser in that the laser is moved relative to the zone along the strip-shaped zone from a first end region to a second end region at the opposite end from the first end region, wherein the first end region is further away from the fluid supply than the second end region. The direction of the heat input acting along a line and produced by means of the laser or another suitable electromagnetic source starts at the end region of the respective strip-shaped zone that is furthest from the air supply or closest to the air suction system. This prevents unwanted folding over of sections that have already been detached onto the sections of the same strip that have not yet been detached. If folding-over occurs, those zones that have not been detached yet may be shadowed and the heating of same impaired.

The method according to an embodiment of the invention for partial detachment of a defined area of a conductive layer from a substrate 1 is described below with reference to FIGS. 1 and 2, said area enclosing a conductor track 2 in the example shown. For this purpose, in the first method step shown in FIG. 1, a laser beam 3 is used to segment the area initially into zones 4. To do this, the laser-beam parameters are set such that only the conductive layer is removed without at the same time affecting the underlying substrate 1 that supports the conductive layer. For this purpose, each of these strip-shaped zones 4 are thermally insulated from the adjoining zones 4 of the conductive layer by making a linear recess 5 along a respective perimeter of the zones 4. To do this, the recesses 5 are made as substantially parallel straight lines, which enclose an acute angle α of 22.5° with the main axes X, Y defined by the known path of the conductor track 2. In practice this almost rules out a path of the recesses 5 parallel to a conductor track 2, thereby avoiding a thermal energy input parallel to the conductor track 2 when detaching the zone 4 adjacent to the conductor track 2, and hence ruling out damage to said conductor track. In addition, the recesses 5 enclosing a respective zone 4 converge in the respective end regions 4a, 4b adjacent to the conductor track 2, and therefore the width b of the zone 4 is reduced in both end regions 4a, 4b. The thermal energy required for detachment is hence likewise reduced, and therefore the thermal energy input can be reduced, at least in the end region adjacent to the conductor track 2.

Figure 2:
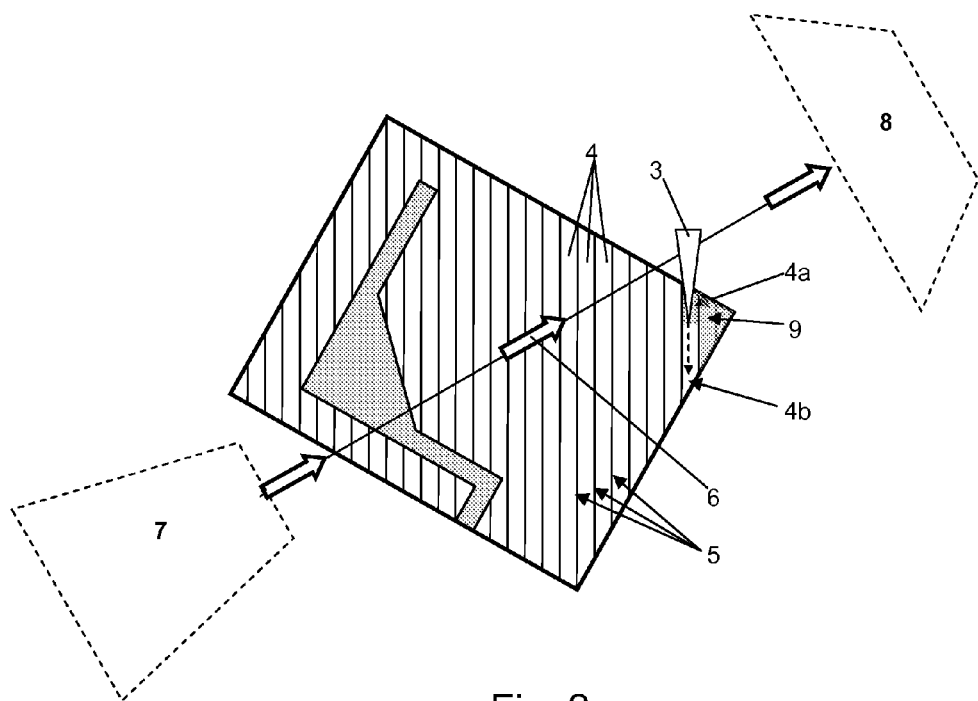
FIG. 2 shows a schematic diagram of an arrangement that uses a fluid flow to remove the zones shown in FIG. 1.

FIG. 2 shows an arrangement that uses a fluid flow 6 to remove the zones 4 shown in FIG. 1, in which arrangement the orientation of the fluid flow 6 relative to the recesses 5 is set such that the fluid flow 6 is incident neither parallel nor orthogonal to the recesses 5. The heat input for reducing the adhesion of the conductive layer to the substrate by means of the laser beam 3, the parameters of which can be adjusted in this method step, is not performed here simultaneously over the entire length of the zone 4 but in a focussed form along the main extent of the zone 4 by moving the laser beam 3 relative to the zone 4 along the strip-shaped zone 4 from the first end region 4a to the second end region 4b. The orientation is chosen here such that the first end region 4a is further away than the second end region 4b from a fluid supply 7 implemented by compressed air, or the first end region 4a is closer than the second end region 4b to a suction system 8. A partial removal of the conductive layer is hence performed, this removal progressing with the relative movement of the laser beam 3, with the specified orientation having the result of preventing an unwanted folding over of already detached sections 9 onto the sections of the same zone 4 that have not been detached yet. Otherwise were folding-over to occur, the sections yet to be detached could be shadowed and the heating thereof impaired. The individual zones 4 are detached successively, with the zones 4 that are furthest from the fluid supply 7 and/or closest to the suction system 8 being heated first, so that the detached particles from the conductive layer cannot be deposited on, and impair the heating of, those zones 4 that still lie beyond in the direction of the fluid flow 6.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B." Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise.

The invention claimed is:

1. A method for partial detachment, using a laser beam, of a defined area of a conductive layer supported by an underlying substrate, the method comprising:
   forming a conductor track, completely within the defined area, with a defined path from a portion of the conductive layer supported by the underlying substrate, the path defining main axes (X, Y);
   providing a plurality of linear recesses, by a laser directly applied to the conductive layer, extending, in a direction that is not parallel to either of the main axes (X, Y), and excluding respective end regions of the plurality of linear recesses, in a direction that is aligned at an acute angle with respect to edges of the conductor track, from at least one of an edge of the defined area or an edge of the conductor track to at least one of another edge of the defined area or another edge of the conductor track,
      wherein providing the plurality of linear recesses segments the defined area into a plurality of zones to be removed, each zone to be removed extending from at least one of an edge of the defined area or an edge of the conductor track to at least one of another edge of the defined area or another edge of the conductor track,
      wherein each of the plurality of linear recesses defines a portion of a perimeter of at least one of a plurality of strip-shaped zones to be removed and,
      wherein each of the plurality of linear recesses thermally insulates an outer edge region of at least one of the plurality of strip-shaped zones to be removed from adjoining ones of the plurality of strip-shaped zones to be removed; and
   heating a portion of a first of the zones to be removed using laser radiation provided by a laser beam until adhesion of the conductive layer to the underlying substrate is substantially reduced and the portion can be detached in a surface-wide manner from the underlying substrate under external influences, wherein laser-beam parameters of the laser beam providing the laser radiation are set such that the conductive layer can be detached without affecting the underlying substrate.

2. The method according to claim 1, wherein the recesses enclose an acute angle (α) both with respect to the main axes (X, Y) and with respect to angle bisectors of the main axes (X, Y).

3. The method according to claim 1, wherein the recesses extend at an angle (α) of between 10° and 35° with respect to one of the main axes (X, Y).

4. The method according to claim 3, wherein in the angle (α) is between 20° and 25°.

5. The method according to claim 1, wherein the recesses, excluding respective end regions of the zones, run parallel to one another.

6. The method according to claim 1, wherein an end region of linear recesses that extend to or from the conductor track have a curve or bend towards the conductor track at an angle of 90° with respect to the conductor track.

7. The method according to claim 1, further comprising separating the first of the zones to be removed from the substrate using at least one of a targeted fluid flow by a fluid supply including a compressed-air supply and suction from a suction system.

8. The method according to claim 7, wherein a direction of the fluid flow is neither parallel nor orthogonal to the direction of the recesses.

9. The method according to claim 7, wherein a zone that first undergoes the heating is located furthest from the fluid supply or closest to the suction system.

10. The method according to claim 7, wherein each of the plurality of strip-shaped zones to be removed undergoes the heating using the laser radiation, wherein, during the heating of a respective strip-shaped zone to be removed, a laser beam providing the laser radiation is moved relative to the respective zone to be removed along the strip shape from a first end region to a second end region at an end of the zone to be removed opposite from the first end region, the first end region being disposed further away from the fluid supply than the second end region.

11. The method according to claim 7, wherein the paths of the recesses between individual segments of the zones extend along parallel straight lines.

12. The method according to claim 1, wherein, prior to the heating a first of the zones to be removed using laser radiation until adhesion of the conductive layer to the underlying substrate is substantially reduced and the first zone to be removed can be detached, the method further comprises dividing the first of the zones to be removed into a plurality of segments.

13. The method according to claim 1, wherein the plurality of zones to be removed are not all of uniform size.

14. A method for partial detachment, using a laser beam, of a defined area of a conductive layer supported by an underlying substrate, the method comprising:

forming a conductor track, completely within the defined area, with a defined path from a portion of the conductive layer supported by the underlying substrate, the path defining main axes (X, Y);

providing a plurality of linear recesses, by a laser directly applied to the conductive layer, extending, in a direction that is not parallel to either of the main axes (X, Y), and excluding respective end regions of the plurality of linear recesses, in a direction that is aligned at an acute angle with respect to edges of the conductor track, from at least one of an edge of the defined area or an edge of the conductor track to at least one of another edge of the defined area or another edge of the conductor track, wherein providing the plurality of linear recesses segments the defined area into a plurality of zones to be removed, each zone to be removed extending from at least one of an edge of the defined area or an edge of the conductor track to at least one of another edge of the defined area or another edge of the conductor track, wherein each of the plurality of linear recesses defines a portion of a perimeter of at least one of a plurality of strip-shaped zones to be removed and, wherein each of the plurality of linear recesses thermally insulates an outer edge region of at least one of the plurality of strip-shaped zones to be removed from adjoining ones of the plurality of strip-shaped zones to be removed; and heating a portion of a first of the zones to be removed using laser radiation provided by a laser beam until adhesion of the conductive layer to the underlying substrate is substantially reduced and the portion can be detached in a surface-wide manner from the underlying substrate under external influences, wherein laser-beam parameters of the laser beam providing the laser radiation are set such that the conductive layer can be detached without affecting the underlying substrate; and separating the portion of the first of the zones to be removed from the substrate using at least one of a targeted fluid flow from a fluid supply and suction from a suction system, wherein each of the plurality of zones to be removed undergoes heating using laser radiation until adhesion of the conductive layer to the underlying substrate is substantially reduced, and wherein each of the plurality of strip-shaped zones to be removed undergoes the heating using the laser radiation, wherein, during the heating of a respective strip-shaped zone to be removed, a laser beam providing the laser radiation is moved relative to the respective zone to be removed along the strip shape from a first end region to a second end region at an end of the zone to be removed opposite from the first end region, the first end region being disposed further away from the fluid supply than the second end region.

* * * * *